United States Patent
Cho et al.

(10) Patent No.: US 8,466,480 B2
(45) Date of Patent: Jun. 18, 2013

(54) LIGHT EMITTING DEVICE, METHOD OF MANUFACTURING THE SAME, LIGHT EMITTING DEVICE PACKAGE AND LIGHTING SYSTEM

(75) Inventors: Ki Hyun Cho, Seoul (KR); Geun Ho Kim, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 55 days.

(21) Appl. No.: 13/008,974

(22) Filed: Jan. 19, 2011

(65) Prior Publication Data

US 2011/0175056 A1 Jul. 21, 2011

(30) Foreign Application Priority Data

Jan. 21, 2010 (KR) ........................ 10-2010-0005481

(51) Int. Cl.
*H01L 21/00* (2006.01)

(52) U.S. Cl.
USPC .............................................. 257/98; 438/29

(58) Field of Classification Search
USPC ................. 257/79, 98–103; 438/22–29
See application file for complete search history.

(56) References Cited

U.S. PATENT DOCUMENTS

| | | | |
|---|---|---|---|
| 7,257,141 B2 * | 8/2007 | Chua .................... | 372/46.013 |
| 7,297,983 B2 | 11/2007 | Hecht et al. | |
| 2003/0143772 A1 * | 7/2003 | Chen ........................ | 438/47 |
| 2004/0036081 A1 * | 2/2004 | Okazaki ................... | 257/99 |
| 2005/0104078 A1 * | 5/2005 | Cheng et al. ............. | 257/98 |
| 2009/0003401 A1 * | 1/2009 | Sekiguchi ............... | 372/50.124 |
| 2009/0014748 A1 | 1/2009 | Hirao et al. | |
| 2011/0017588 A1 | 1/2011 | Kim et al. ............... | 204/192.12 |

FOREIGN PATENT DOCUMENTS

| | | |
|---|---|---|
| CN | 1992226 A | 7/2007 |
| EP | 1 501 162 | 1/2005 |
| JP | 1996-222761 A | 8/1996 |
| KR | 10-2008-0047838 A | 5/2008 |
| KR | 10-0885664 B1 | 2/2009 |
| KR | 10-2009-0104931 A | 10/2009 |
| KR | 10-2010-0025637 A | 3/2010 |

OTHER PUBLICATIONS

Korean Office Action dated Feb. 7, 2011 issued in Application No. 10-2010-0005481.
Chinese Office Action issued in CN Application No. 2011100268539 dated Dec. 26, 2012.

* cited by examiner

Primary Examiner — Calvin Lee
(74) Attorney, Agent, or Firm — KED & Associates, LLP

(57) ABSTRACT

A light emitting device according to the embodiment includes a conductive support substrate including plural pairs of first and second conductive layers; alight emitting structure layer including a first conductive semiconductor layer, a second conductive semiconductor layer, and an active layer between the first and second conductive semiconductor layers on the conductive support substrate; and an electrode on the light emitting structure layer. The first and second conductive layers are formed by using the same material.

20 Claims, 6 Drawing Sheets

_US 8,466,480 B2_

LIGHT EMITTING DEVICE, METHOD OF MANUFACTURING THE SAME, LIGHT EMITTING DEVICE PACKAGE AND LIGHTING SYSTEM

The present application claims priority of Korean Patent Application No. 10-2010-0005481 filed on Jan. 21, 2010, which is hereby incorporated by reference in its entirety.

BACKGROUND

The embodiment relates to a light emitting device and a method of manufacturing the same.

A light emitting diode (LED) is a semiconductor light emitting device that converts current into light.

A wavelength of light emitted from the LED may vary depending on a semiconductor material used for manufacturing the LED. This is because the wavelength of the emitted light varies depending on the bandgap of the semiconductor material, that is, the energy difference between valance band electrons and conduction band electrons.

The LED can generate light having high brightness, so that the LED has been expensively used as a light source for a display device, a vehicle, or a lighting device. In addition, the LED can represent a white color having superior light efficiency by employing luminescence materials or combining LEDs having various colors.

SUMMARY

The embodiment provides a light emitting device having a novel structure and a method of manufacturing the same.

The embodiment provides a light emitting device having a conductive support substrate with reduced stress and a method of manufacturing the same.

The embodiment provides a light emitting device having improved heat dissipation characteristics and a method of manufacturing the same.

A light emitting device according to the embodiment may include a conductive support substrate including plural pairs of first and second conductive layers; a light emitting structure layer including a first conductive semiconductor layer, a second conductive semiconductor layer, and an active layer between the first and second conductive semiconductor layers on the conductive support substrate; and an electrode on the light emitting structure layer, wherein the first and second conductive layers are formed by using a same material.

A light emitting device according to the embodiment may include a conductive support substrate including plural pairs of first and second conductive layers; a light emitting structure layer including a first conductive semiconductor layer, a second conductive semiconductor layer, and an active layer between the first and second conductive semiconductor layers on the conductive support substrate; and an electrode on the light emitting structure layer, wherein the first conductive layer has compressive stress and the second conductive layer has tensile stress.

A light emitting device package according to the embodiment may include a package body; first and second electrode layers on the package body; a light emitting device electrically connected to the first and second electrode layers; and a molding member on the light emitting device, wherein the light emitting device includes a conductive support substrate including plural pairs of first and second conductive layers; a light emitting structure layer including a first conductive semiconductor layer, a second conductive semiconductor layer, and an active layer between the first and second conductive semiconductor layers on the conductive support substrate; and an electrode on the light emitting structure layer, and wherein the first and second conductive layers are formed by using a same material.

A method of manufacturing a light emitting device according to the embodiment may include the steps of forming a light emitting structure layer including a first conductive semiconductor layer, a second conductive semiconductor layer and an active layer between the first and second conductive semiconductor layers on a growth substrate; forming a conductive support substrate including plural pairs of first and second conductive layers on the light emitting structure layer; separating the growth substrate from the light emitting structure layer; and forming an electrode on the light emitting structure layer, wherein the first and second conductive layers include same materials.

DETAILED DESCRIPTION OF THE EMBODIMENTS

Figure 1:
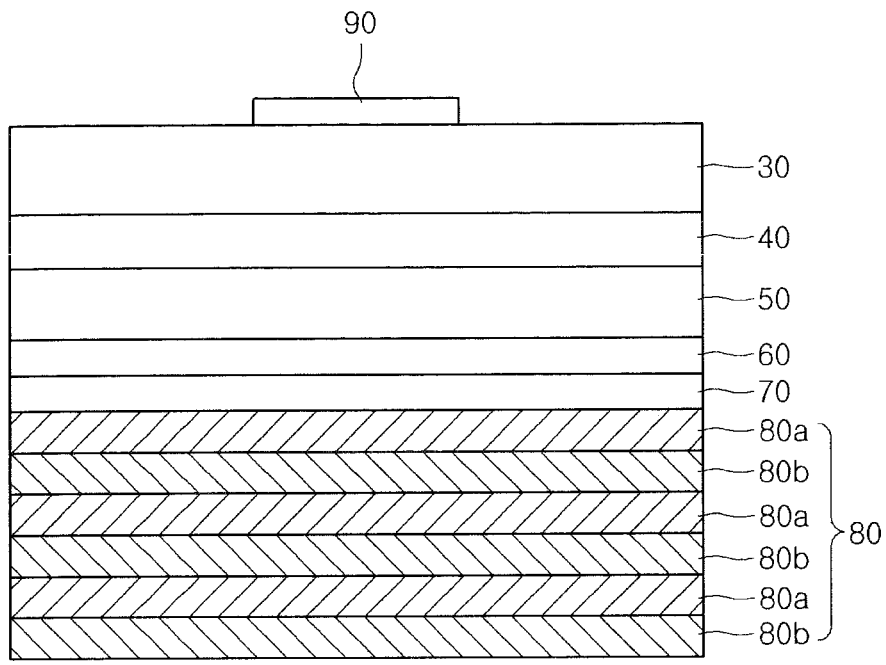
FIG. 1 is a view showing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" over the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

Hereinafter, a light emitting device and a method of manufacturing the same according to the embodiment will be described with reference to accompanying drawings.

FIG. 1 is a view showing a light emitting device according to the first embodiment.

Referring to FIG. 1, the light emitting device according to the first embodiment includes a conductive support substrate 80, a reflective layer 70 on the conductive support substrate 80, an ohmic contact layer 60 on the reflective layer 70, a light emitting structure layer formed on the ohmic contact layer 60 and including a second conductive semiconductor layer 50, an active layer 40 and a first conductive semiconductor layer 30, and an electrode 90 formed on the first conductive semiconductor layer 30.

The conductive support substrate 80 may include first and second conductive layers 80a and 80b. When the first and second conductive layers 80a and 80b are defined as a pair of unit layers, the conductive support substrate 80 may include plural pairs of unit layers.

For instance, the conductive support substrate 80 may include 2 to 80 pairs of the first and second conductive layers 80a and 80b. Preferably, the conductive support substrate 80 may include 30 to 70 pairs of the first and second conductive layers 80a and 80b. More preferably, the conductive support substrate 80 may include 40 to 60 pairs of the first and second conductive layers 80a and 80b.

The first and second conductive layers 80a and 80b can be formed by using the same metal or heterogeneous metals.

For instance, the first and second conductive layers 80a and 80b may have a thickness of 0.1 μm to 10 μm, respectively. Preferably, one of the first and second conductive layers 80a and 80b may have a thickness of 0.4 μm to 0.8 μm, and the other of the first and second conductive layers 80a and 80b may have a thickness of 0.8 μm to 1.2 μm.

The conductive support substrate 80 including a plurality of first and second conductive layers 80a and 80b may have a thickness of 50 μm to 200 μm.

The first conductive layer 80a may have compressive stress and the second conductive layer 80b may have tensile stress. In contrast, the first conductive layer 80a may have tensile stress and the second conductive layer 80b may have compressive stress.

Since the first and second conductive layers 80a and 80b have stresses opposite to each other, the compressive stress of the first conductive layer 80a is offset with the tensile stress of the second conductive layer 80b, so that the stress of the conductive support substrate 80 can be reduced.

For instance, the first conductive layer 80a may have the compressive stress of 100 MPa to 2000 MPa, and the second conductive layer 80b may have the tensile stress of 100 MPa to 2000 MPa.

The first and second conductive layers 80a and 80b can be formed by using metals, which are suitable for the dry deposition process such as the sputtering process or the E-beam evaporation process. For instance, the first and second conductive layers 80a and 80b may include at least one of Cu, Mo, Al, Ni, and Cu—W. In detail, the first and second conductive layers 80a and 80b may include the material, such as Cu. In addition, the first conductive layer 80a may include Al and the second conductive layer 80b may include Ni.

The reflective layer 70 may include at least one of Ag, Al, Cu and Ni having high reflectivity. The ohmic contact layer 60 may include a transparent electrode using at least one of ITO, ZnO, $RuO_x$, $TiO_x$, and $IrO_x$.

It is not necessary to provide the reflective layer 70 and the ohmic contact layer 60. That is, when the reflective layer 70 is formed of a material with ohmic characteristic, the ohmic contact layer 60 can be omitted.

The light emitting structure layer may include compound semiconductor layers of group III to V elements. For example, the light emitting structure layer may include a stack structure including the first conductive semiconductor layer 30, the active layer 40, and the second conductive semiconductor layer 50. As power is applied to the first and second conductive semiconductor layers 30 and 50, the active layer 40 emits light.

The first conductive semiconductor layer 30 may include an n type semiconductor layer having a compositional formula of $InAl_yGa_{1-x-y}N$ ($0 \leq x \leq 1$, $0 \leq y \leq 1$, $0 \leq x+y \leq 1$). The first conductive semiconductor layer 30 may be selected from the group consisting of InAlGaN, GaN, AlGaN, AlInN, InGaN, AlN, and InN and may be doped with n type dopant, such as Si, Ge or Sn. The first conductive semiconductor layer 30 may have a single layer structure or a multiple layer structure, but the embodiment is not limited thereto.

The active layer 40 is formed under the first conductive semiconductor layer 30. The active layer 40 may have a single quantum well structure, a multiple quantum well (MQW) structure, a quantum dot structure, or a quantum wire structure. The active layer 40 may include a semiconductor material having a compositional formula of $InAl_yGa_{1-x-y}N$ ($0 \leq x \leq 1$, $0 \leq y \leq 1$, $0 \leq x+y \leq 1$). If the active layer 40 has the MQW structure, the active layer 40 may have a stack structure of a plurality of well layers and a plurality of barrier layers. For example, the active layer 40 may include a stack structure of InGaN well/GaN barrier layers.

A clad layer (not shown) doped with n type dopant or p type dopant may be formed on and/or under the active layer 40. The clad layer may include an AlGaN layer or an InAlGaN layer.

The second conductive semiconductor layer 50 is formed under the active layer 40 and may include a p type semiconductor layer. The p type semiconductor layer may include a semiconductor material having a compositional formula of $In_xAl_yGa_{1-x-y}N$ ($0 \leq x \leq 1$, $0 \leq y \leq 1$, $0 \leq x+y \leq 1$). For instance, the p type semiconductor layer may be selected from the group consisting of InAlGaN, GaN, AlGaN, InGaN, AlInN, AlN, and InN, and may be doped with P type dopant, such as Mg, Zn, Ca, Sr, or Ba.

The second conductive semiconductor layer 50 can be prepared as a single layer or a multiple layer, but the embodiment is not limited thereto.

Meanwhile, different from the above description, the first conductive semiconductor layer 30 may include a p type semiconductor layer, and the second conductive semiconductor layer 50 may include an n type semiconductor layer. In addition, a third conductive semiconductor layer (not shown) including an n type semiconductor layer or a P type semiconductor layer may be formed under the second conductive semiconductor layer 50. Accordingly, the light emitting structure layer may have at least one of NP, PN, NPN, and PNP junction structures. In addition, the doping concentration of impurities in the first and second conductive semiconductor layers 30 and 50 may be uniform or irregular. In other words, the light emitting structure layer may have various structures, but the embodiment is not limited thereto.

The electrode 90 is formed on the first conductive semiconductor layer 30. The electrode 90 may include at least one of Cu, Ni, Au, Al and Pt such that the wire bonding can be easily performed. The electrode 90 may formed with a single layer or multiple layer. The electrode 90 supplies power to the active layer 40 together with the conductive support substrate 80.

According to the light emitting device of the first embodiment, the conductive support substrate 80 is formed through the dry deposition scheme, so the wet plating process causing the environmental contamination can be omitted.

In addition, according to the light emitting device of the first embodiment, the conductive support substrate 80 is formed through the dry deposition scheme, without bonding the conductive support substrate 80 using a solder metal, thereby preventing the reliability of the light emitting device from being degraded caused by the crack or a low heat transfer characteristic of the solder metal.

Further, according to the light emitting device of the first embodiment, the conductive support substrate 80 includes the first and second conductive layers 80a and 80b, so the stress of the conductive support substrate 80 can be attenuated, thereby reducing the defect of the light emitting structure layer.

Figure 2:
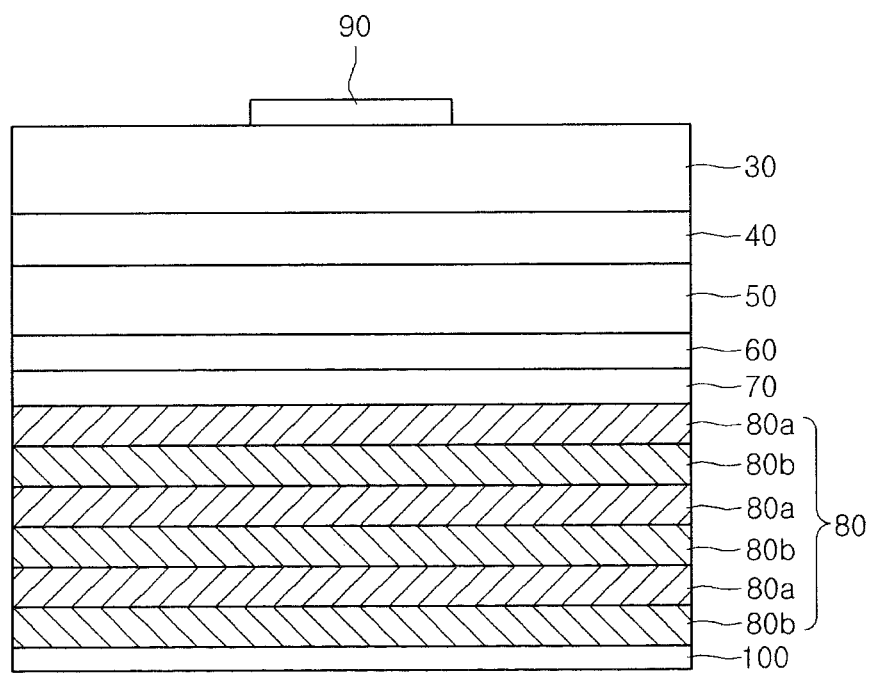
FIG. 2 is a view showing a light emitting device according to the second embodiment.

FIG. 2 is a sectional view showing a light emitting device according to the second embodiment.

In the following description of the second embodiment, details of the elements and structures that have been described in the first embodiment will be omitted in order to avoid redundancy.

Referring to FIG. 2, the light emitting device according to the second embodiment further includes an anti-oxidation layer 100 under the conductive support substrate 80 of the light emitting device.

The anti-oxidation layer 100 prevents the conductive support substrate 80 from being oxidized. The anti-oxidation layer 100 can be formed by using a metal, such as Au or Pt, at a thickness of 10 Å to 10 μm. For example, the anti-oxidation layer 100 may formed at a thickness of 100 Å to 1000 Å.

Figure 3:
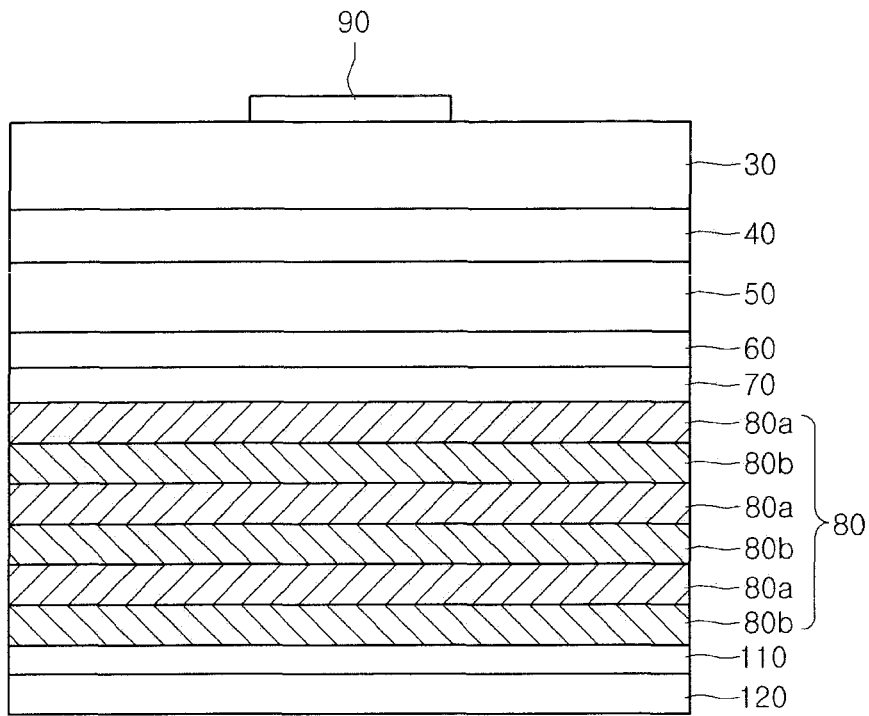
FIG. 3 is a view showing a light emitting device according to the third embodiment.

FIG. 3 is a sectional view showing a light emitting device according to the third embodiment.

In the following description of the third embodiment, details of the elements and structures that have been described in the first embodiment will be omitted in order to avoid redundancy.

Referring to FIG. 3, the light emitting device according to the third embodiment further includes a diffusion barrier layer 110 and a solder metal layer 120 under the conductive support substrate 80.

The diffusion barrier layer 110 is used to prevent the solder metal layer 120 from being diffused, and the solder metal layer 120 is used to attach the light emitting device to a body of the light emitting device package. The diffusion barrier layer 110 may be formed by using a metal, such as Ni, at a thickness of 100 Å to 1000 Å.

The solder metal layer 120 may include an Au—Sn solder, an Ag—Sn solder or a Pb—Sn solder. The solder metal layer 120 may be formed at a thickness of 1000 Å to 5000 Å. For example, the solder metal layer 120 may be formed at a thickness of 3000 Å.

In addition, an anti-oxidation layer (not shown) can be formed under the solder metal layer 120 to prevent the solder metal layer 120 from being oxidized.

Figure 4:
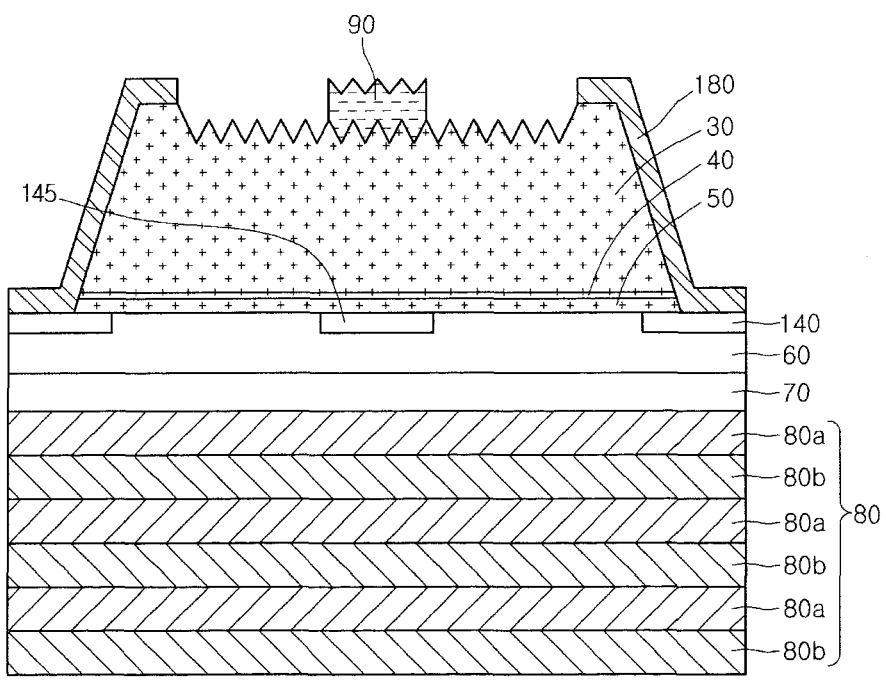
FIG. 4 is a view showing a light emitting device according to the fourth embodiment.

FIG. 4 is a sectional view showing a light emitting device according to the fourth embodiment.

In the following description of the fourth embodiment, details of the elements and structures that have been described in the first embodiment will be omitted in order to avoid redundancy.

Referring to FIG. 4, the light emitting device according to the fourth embodiment further includes a protection layer 140 along the top edge of the ohmic contact layer 60, and a current blocking region 145 between the second conductive semiconductor layer 50 and the ohmic contact layer 60.

At least a part of the current blocking region 145 may be overlapped with the electrode 90 in a vertical direction to reduce concentration of a current along the shortest path between the electrode 90 and the conductive support substrate 80, thereby improving the light emitting efficiency of the light emitting device.

The current blocking region 145 may be formed of a material less conductive than the ohmic contact layer 60, a material capable of making Schottky contact with the second conductive type semiconductor layer 50, or an electrically insulating material. For example, the current blocking region 145 may include at least one of ITO, IZO, IZTO, IAZO, IGZO, IGTO, AZO, ATO, ZnO, SiO2, SiOx, SiOxNy, Si3N4, Al2O3, TiOx, Ti, Al, and Cr.

The protection layer 140 may be formed along the top edge of the ohmic contact layer 60. The protection layer 140 may be formed between top edge parts of the light emitting structure layer and the ohmic contact layer 60 by using an electrically insulating material such as ZnO or SiO$_2$. A part of the protection layer 140 is overlapped with the light emitting structure layer in a vertical direction.

Owning to the protection layer 140, the lateral distance between the ohmic contact layer 60 and an active layer 40 can be increased. Therefore, the possibility of a short circuit may be decreased between the ohmic contact layer 60 and the active layer 40.

In addition, when isolation etching is performed to separate the light emitting structure layer as a unit chip in a chip separation process, the protection layer 140 prevents a short circuit that may be caused by particles generated from the ohmic contact layer 60 and attached between the second conductive semiconductor layer 50 and the active layer 40 or between the active layer 40 and a first conductive semiconductor layer 30. The protection layer 140 is formed of a material that does not break or generates particles or an electrically insulating material that does not cause a short circuit although it breaks or generates a small amount of particles.

In an isolation etching process for separating the light emitting structure layer as a unit chip, the side surface of the light emitting structure layer may be sloped, and a part of the sloped surface is overlapped with the protection layer 140 in a vertical direction.

The top surface of the protection layer 140 may be partially exposed by the isolation etching process. Therefore, a part of the protection layer 140 is overlapped with the light emitting structure layer in a vertical direction but the other part of the protection layer 140 is not overlapped with the light emitting structure layer in the vertical direction.

A passivation layer 180 may be disposed at least on the side surface of the light emitting structure layer. The passivation layer 180 may be formed on the top surfaces of the first conductive semiconductor layer 30 and the protection layer 140, but not limited thereto.

The passivation layer 180 may be formed to electrically protect the light emitting structure layer. For example, the passivation layer 180 may be formed of SiO$_2$, SiO$_x$, SiO$_x$N$_y$, Si$_3$N$_4$, or Al$_2$O$_3$, but not limited thereto.

Figure 5:
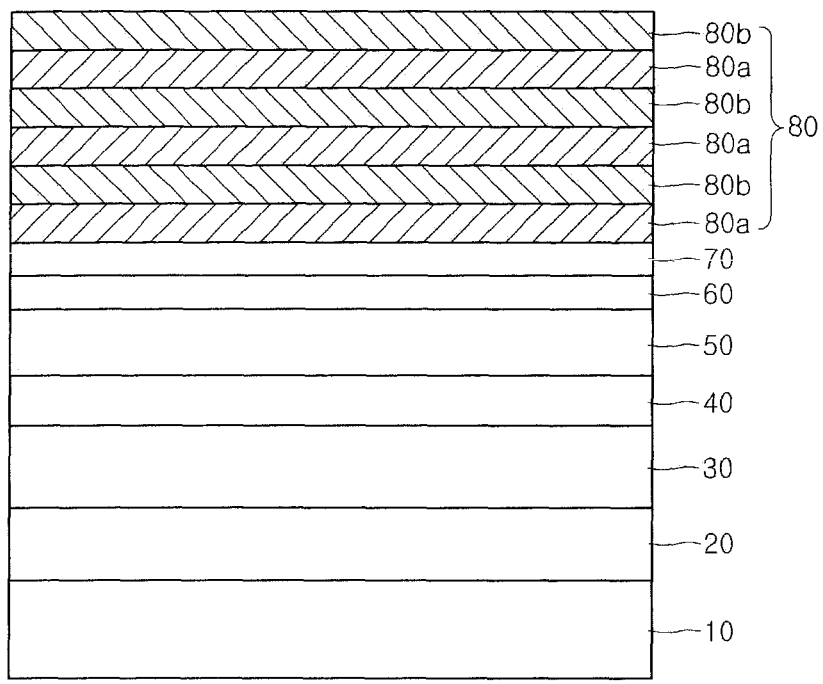
FIGS. 5 to 7 are sectional views showing a method of manufacturing a light emitting device according to the embodiments.
Figure 6:
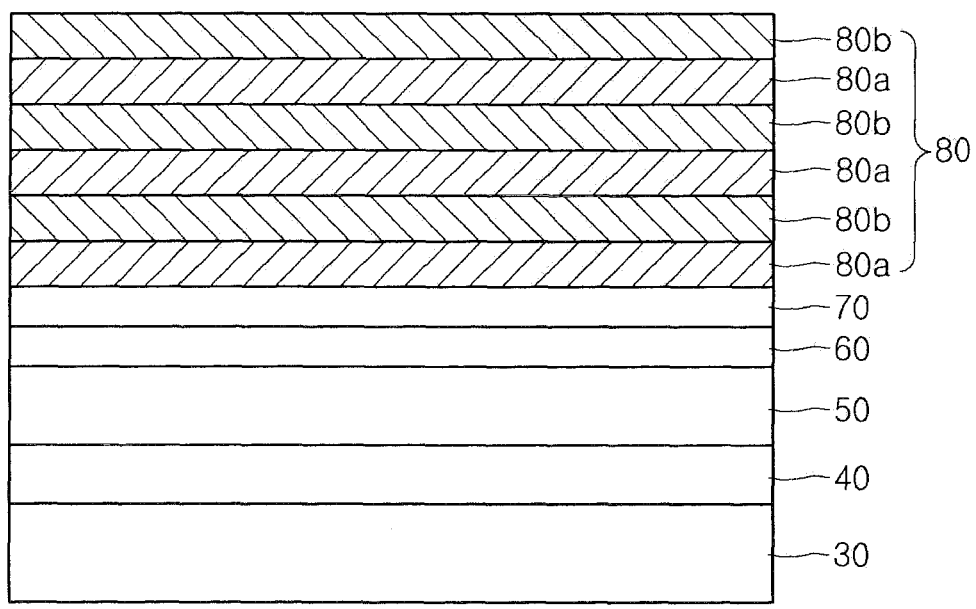
Figure 7:
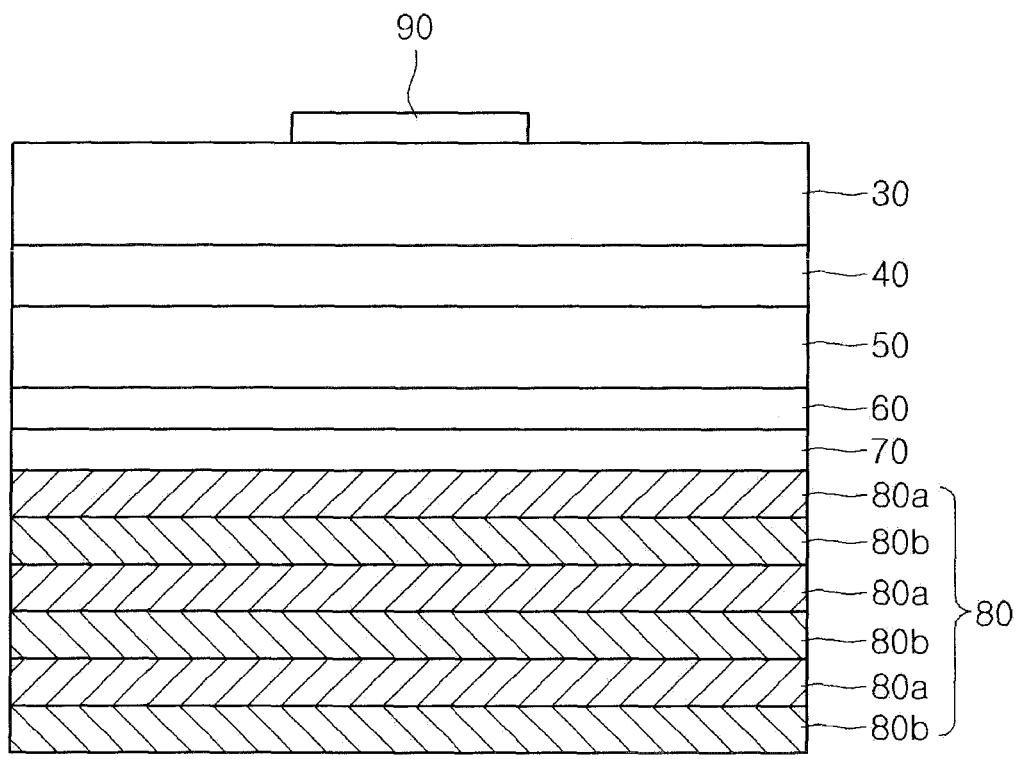

FIGS. 5 to 7 are sectional views showing a method of manufacturing the light emitting device according to the embodiments.

Referring to FIG. 5, an undoped nitride layer 20 including a buffer layer is formed on a growth substrate 10, and the light emitting structure layer including the first conductive semiconductor layer 30, the active layer 40 and the second conductive semiconductor layer 50 is formed on the undoped nitride layer 20.

In addition, the ohmic contact layer 60 is formed on the second conductive semiconductor layer 50, the reflective layer 70 is formed on the ohmic contact layer 60, and the conductive support substrate 80 is formed on the reflective layer 70.

The growth substrate 10 may include at least one selected from the group consisting of sapphire (Al$_2$O$_3$), SiC, GaAs, ZnO and MgO. For instance, the sapphire substrate can be used as the growth substrate 10.

The undoped nitride layer 20 may include a GaN-based semiconductor layer. For instance, the undoped nitride layer 20 may include an undoped GaN layer, which is grown by injecting hydrogen gas and ammonia gas into a chamber together with trimethyl gallium (TMGa) gas.

The first conductive semiconductor layer 30 can be grown by injecting trimethyl gallium (TMGa) gas, ammonia gas, hydrogen gas and silane (SiH$_4$) gas including n type impurities, such as silicon, into the chamber. In addition, the active layer 40 and the second conductive semiconductor layer 50 are formed on the first conductive semiconductor layer 30.

The active layer 40 may have a single quantum well structure or a multiple quantum well (MQW) structure. For instance, the active layer 40 can be formed by using a semiconductor material having a compositional formula of $In_xAl_yGa_{1-x-y}N$ ($0 \leq x \leq 1$, $0 \leq y \leq 1$, $0 \leq x+y \leq 1$).

The second conductive semiconductor layer 50 may be grown by injecting TMGa gas, NH$_3$ gas, H$_2$ gas and (EtCp$_2$Mg){Mg(C$_2$H$_5$C$_5$H$_4$)$_2$} gas including p type impurities (for example, Mg) into the chamber The ohmic contact layer 60 and the reflective layer 70 can be formed on the second conductive semiconductor layer 50. It is not absolutely necessary to provide the reflective layer 70 and the ohmic contact layer 60. That is, one or both of the reflective layer 70 and the ohmic contact layer 60 can be omitted.

The ohmic contact layer 60 may include a transparent electrode using at least one of ITO, ZnO, RuO$_x$, TiO$_x$, and IrO$_x$. In addition, the reflective layer 70 may include at least one of Ag, Al, Cu and Ni having high reflectivity.

The conductive support substrate 80 is formed on the reflective layer 70. In detail, the first conductive layer 80a is formed on the reflective layer 70 and the second conductive layer 80b is formed on the first conductive layer 80a. In addition, another first conductive layer 80a is formed on the second conductive layer 80b and another second conductive layer 80b is formed another first conductive layer 80a, repeatedly.

The first and second conductive layers 80a and 80b can be formed through the dry deposition scheme, such as the sputtering or the E-beam evaporation. If the sputtering scheme is employed, a high-speed sputtering scheme is used. According to the high-speed sputtering scheme, a magnetic material is formed on a rear surface of a negative sputtering target such that a magnetic field can be performed perpendicularly to an electric field. In this case, the migration of electrons is restricted around the negative sputtering target and the rotational reciprocating movement of the electrons is induced to lengthen the moving route of the electrons, thereby increasing the plasma density and improving the product yield of the sputtering process. The first and second conductive layers 80a and 80b can be formed through in situ process.

The first and second conductive layers 80a and 80b can be formed by using the same material or heterogeneous materials.

If the first and second conductive layers 80a and 80b are formed by using the same material, the conditions of the sputtering process are adjusted to allow the first and second conductive layers 80a and 80b to have the tensile stress and the compressive stress, respectively.

For instance, in order to allow the first and second conductive layers 80a and 80b to have the tensile stress and the compressive stress, respectively, energy of the sputtered metal or the evaporated metal is increased such that the metal reaching the substrate may diffuse to a desired position, thereby forming the conductive layer having the compressive stress.

The method for forming the conductive layer having the compressive stress by increasing the energy of the metal may include a scheme of increasing power during the sputtering process, a scheme of lowering pressure of sputtering gas, a scheme of increasing the temperature of the substrate and a scheme of varying power of the sputtering process. For instance, according to the scheme of varying power of the sputtering process, a pulse source and a DC source are prepared as a power source and a pulse is applied to form the conductive layer having the compressive stress or a DC current is applied to form the conductive layer having the tensile stress.

In this manner, the conductive layer having the tensile stress or the compressive stress can be selectively formed by controlling the power, gas pressure and the substrate temperature during the sputtering process.

In detail, the first and second conductive layers 80a and 80b can be formed by varying the sputtering power, the pressure of the sputtering gas, the substrate temperature or the sputtering power source.

In addition, when the first and second conductive layers 80a and 80b are formed by using the heterogeneous materials, metals suitable for representing the tensile stress or the compressive stress are employed. In this case, the scheme for allowing the same metal to represent the tensile stress and the compressive stress can be applied when forming the first and second conductive layers 80a and 80b.

Meanwhile, the method for manufacturing the light emitting device according to the second embodiment may include the step of forming the anti-oxidation layer 100 on the conductive support substrate 80, and the method for manufacturing the light emitting device according to the third embodiment may include the step of forming the diffusion barrier layer 110 and the solder metal layer 120 on the conductive support substrate 80. In addition, the step of forming the anti-oxidation layer on the solder metal layer 120 may be added. the method for manufacturing the light emitting device according to the fourth embodiment may include the step of forming the protection layer 140 and the current blocking region 145 between the second conductive semiconductor layer 50 and the ohmic contact layer 60, and the step of forming the passivation layer 180 on the light emitting structure layer.

Referring to FIG. 6, the growth substrate 10 and the undoped nitride layer 20 are removed. The growth substrate 10 and the undoped nitride layer 20 can be removed through the laser lift off scheme or the chemical etching scheme.

Referring to FIG. 7, the electrode 90 is formed on a predetermined portion of the first conductive semiconductor layer 30, which is exposed as the growth substrate 10 and the undoped nitride layer 20 have been removed.

In this manner, the light emitting device according to the embodiments can be manufactured.

Figure 8:
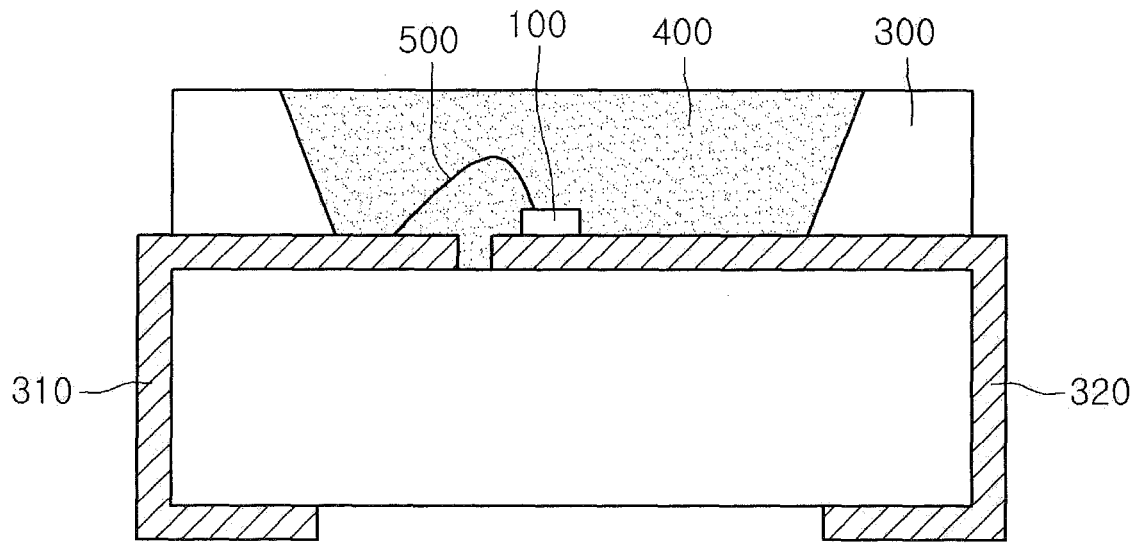
FIG. 8 is a sectional view showing a light emitting device package according to the embodiment.

FIG. 8 is a sectional view showing a light emitting device package according to the embodiment.

Referring to FIG. 8, the light emitting device package according to the embodiment includes a package body 300, first and second electrode layers 310 and 320 formed on the package body 300, the light emitting device 100 provided on the package body 300 and electrically connected to the first and second electrode layers 310 and 320 and a molding member 400 that surrounds the light emitting device 100.

The package body 300 may include silicone, synthetic resin or a metallic material. An inclined surface may be formed around the light emitting device 100.

The first and second electrode layers 310 and 320 are electrically isolated from each other to supply power to the light emitting device 100. In addition, the first and second electrode layers 310 and 320 reflect the light emitted from the light emitting device 100 to improve the light efficiency and dissipate heat generated from the light emitting device 100 to the outside.

The light emitting device 100 can be installed on the package body 300 or the first or second electrode layer 310 or 320. The light emitting device 100 may include one of the light emitting devices according to the embodiments shown in FIGS. 1 to 7.

The light emitting device 100 may be electrically connected to the first electrode layer 310 through a wire 300 and directly make contact with the second electrode layer 310 so that the light emitting device 100 may be electrically connected to the second electrode layer 320.

The molding member 400 surrounds the light emitting device 100 to protect the light emitting device 100. In addition, the molding member 40 may include luminescence material to change the wavelength of the light emitted from the light emitting device 100.

A plurality of light emitting device packages according to the embodiment may be arrayed on a substrate, and an optical member including a light guide plate, a prism sheet, a diffusion sheet, and a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 9:
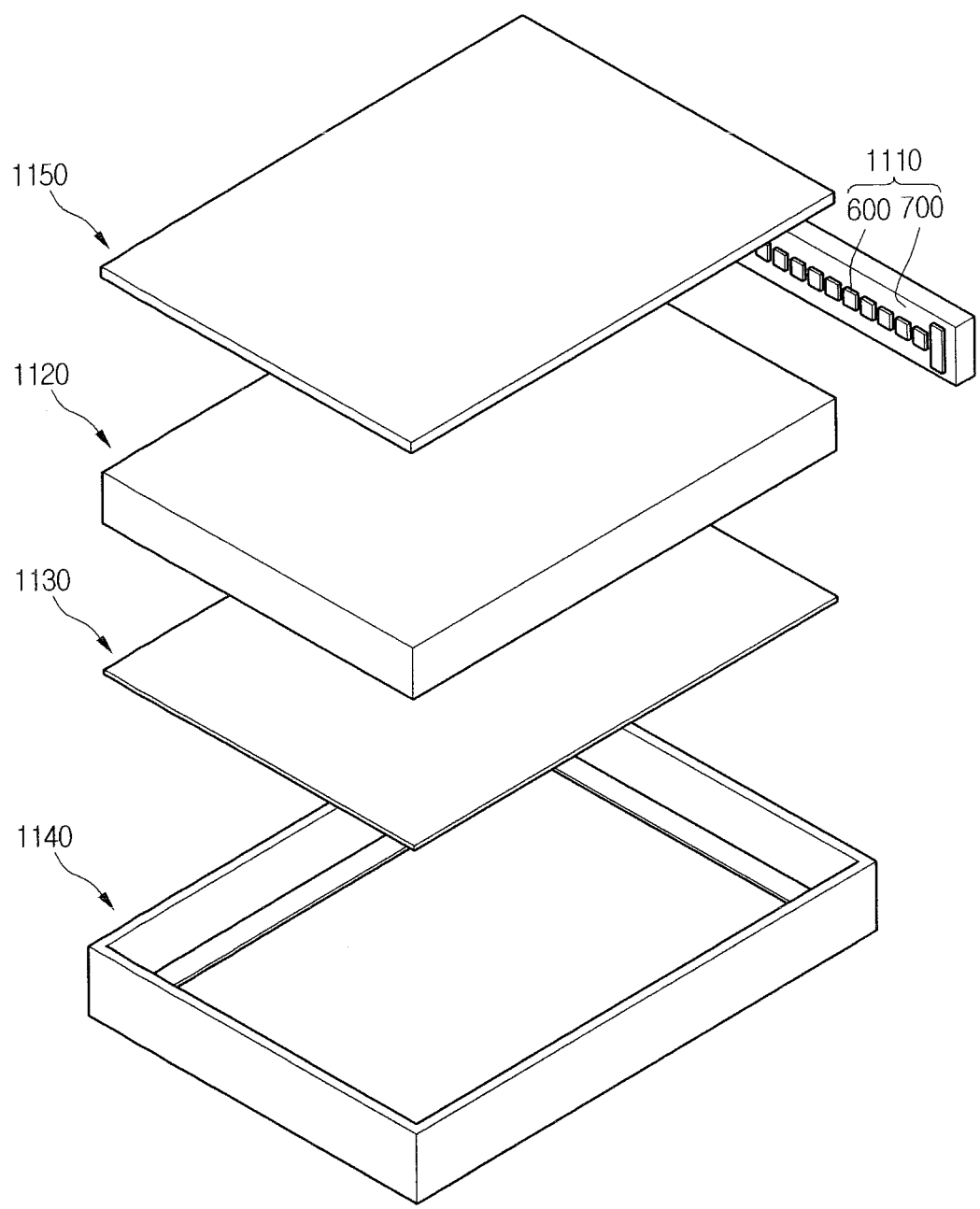
FIG. 9 is an exploded perspective view showing a backlight unit including a light emitting device or a light emitting device package according to the embodiment.

FIG. 9 is a view showing a backlight unit including the light emitting device or the light emitting device package according to the embodiment. The backlight unit 1100 shown in FIG. 9 is an example of a lighting system, and the embodiment is not limited thereto.

Referring to FIG. 9, the backlight unit 1100 includes a bottom frame 1140, a light guide member 1120 installed in the bottom frame 1140, and a light emitting module 1110 installed at one side or on the bottom surface of the light guide member 1120. In addition, a reflective sheet 1130 is disposed below the light guide member 1120.

The bottom frame 1140 has a box shape having an open top surface to receive the light guide member 1120, the light emitting module 1110 and the reflective sheet 1130 therein. In addition, the bottom frame 1140 may include metallic material or resin material, but the embodiment is not limited thereto.

The light emitting module 1110 may include a substrate 700 and a plurality of light emitting device packages 600 installed on the substrate 700. The light emitting device packages 600 provide the light to the light guide member 1120. According to the light emitting module 1110 of the embodiment, the light emitting device packages 600 are installed on the substrate 700. However, it is also possible to directly install the light emitting device 100 according to the embodiment.

As shown in FIG. 9, the light emitting module 1110 is installed on at least one inner side of the bottom frame 1140 to provide the light to at least one side of the light guide member 1120.

In addition, the light emitting module 1110 can be provided below the bottom frame 1140 to provide the light toward the bottom surface of the light guide member 1120. Such an arrangement can be variously changed according to the design of the backlight unit 1100, and the embodiment is not limited thereto.

The light guide member 1120 is installed in the bottom frame 1140. The light guide member 1120 converts the light emitted from the light emitting module 1110 into the surface light to guide the surface light toward a display panel (not shown).

The light guide member 1120 may include a light guide plate. For instance, the light guide plate can be manufactured by using acryl-based resin, such as PMMA (polymethyl methacrylate), PET (polyethylene terephthalate), PC (polycarbonate), COC or PEN (polyethylene naphthalate) resin.

An optical sheet 1150 may be provided over the light guide member 1120.

The optical sheet 1150 may include at least one of a diffusion sheet, a light collection sheet, a brightness enhancement sheet, and a fluorescent sheet. For instance, the optical sheet 1150 has a stack structure of the diffusion sheet, the light collection sheet, the brightness enhancement sheet, and the fluorescent sheet. In this case, the diffusion sheet uniformly diffuses the light emitted from the light emitting module 1110 such that the diffused light can be collected on the display panel (not shown) by the light collection sheet. The light output from the light collection sheet is randomly polarized and the brightness enhancement sheet increases the degree of polarization of the light output from the light collection sheet. The light collection sheet may include a horizontal and/or vertical prism sheet. In addition, the brightness enhancement sheet may include a dual brightness enhancement film and the fluorescent sheet may include a transmittive plate or a transmittive film including phosphors.

The reflective sheet 1130 can be disposed below the light guide member 1120. The reflective sheet 1130 reflects the light, which is emitted through the bottom surface of the light guide member 1120, toward the light exit surface of the light guide member 1120.

The reflective sheet 1130 may include resin material having high reflectivity, such as PET, PC or PVC resin, but the embodiment is not limited thereto.

Figure 10:
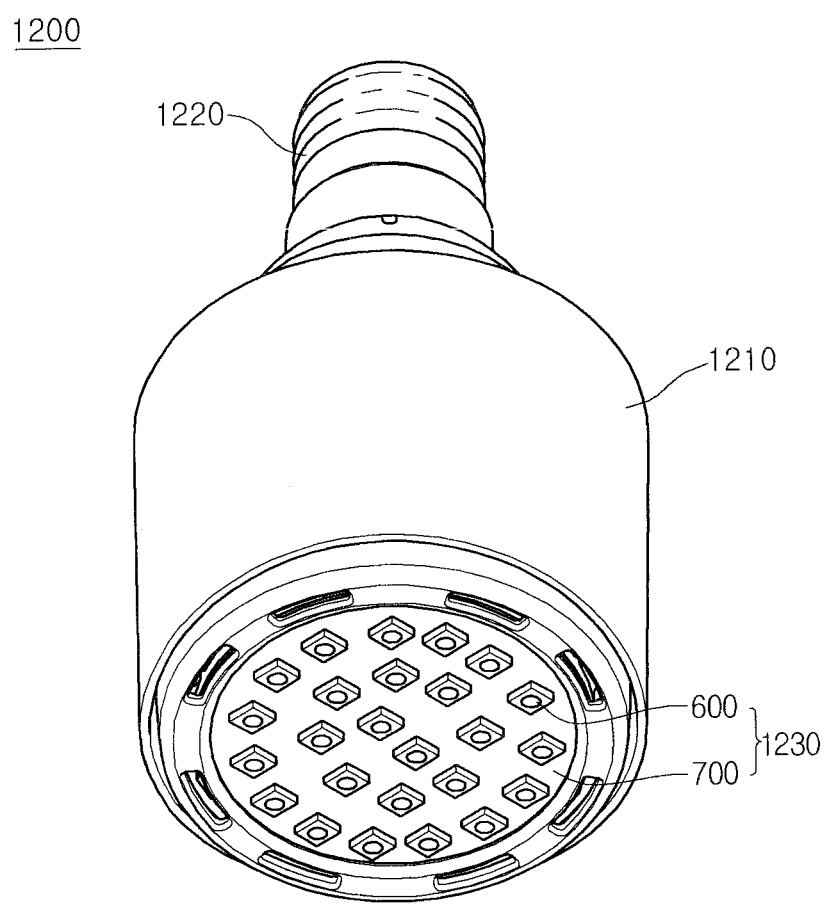
FIG. 10 is a perspective view showing a light unit including a light emitting device or a light emitting device package according to the embodiment.

FIG. 10 is a perspective view showing a lighting unit 1200 including the light emitting device or the light emitting device package according to the embodiment. The lighting unit 1200 shown in FIG. 10 is an example of a lighting system and the embodiment is not limited thereto.

Referring to FIG. 10, the lighting unit 1200 includes a case body 1210, a light emitting module 1230 installed in the case body 1210, and a connection terminal 1220 installed in the case body 1210 to receive power from an external power source.

Preferably, the case body 1210 includes a material having superior heat dissipation property. For instance, the case body 1210 includes a metallic material or a resin material.

The light emitting module 1230 may include a substrate 700 and at least one light emitting device package 600 installed on the substrate 700. In the light emitting module 1230 according to the embodiment, the light emitting device package 600 is installed on the substrate 700. However, it is also possible to direct install the light emitting device 100 according to the embodiment.

The substrate 700 includes an insulating member printed with a circuit pattern. For instance, the substrate 700 includes a PCB (printed circuit board), an MC (metal core) PCB, a flexible PCB, or a ceramic PCB.

In addition, the substrate 700 may include a material that effectively reflects the light. The surface of the substrate 700 can be coated with a color, such as a white color or a silver color, to effectively reflect the light.

At least one light emitting device package 600 according to the embodiment can be installed on the substrate 700. Each light emitting device package 600 may include at least one LED (light emitting diode). The LED may include a colored LED that emits the light having the color of red, green, blue or white and a UV (ultraviolet) LED that emits UV light.

The LEDs of the light emitting module 1230 can be variously arranged to provide various colors and brightness. For instance, the white LED, the red LED and the green LED can be arranged to achieve the high color rendering index (CRI). In addition, a fluorescent sheet can be provided in the path of the light emitted from the light emitting module 1230 to change the wavelength of the light emitted from the light emitting module 1230. For instance, if the light emitted from the light emitting module 1230 has a wavelength band of blue light, the fluorescent sheet may include yellow phosphors. In this case, the light emitted from the light emitting module 1230 passes through the fluorescent sheet so that the light is viewed as white light.

The connection terminal 1220 is electrically connected to the light emitting module 1230 to supply power to the light emitting module 1230. Referring to FIG. 10, the connection terminal 1220 has a shape of a socket screw-coupled with the external power source, but the embodiment is not limited thereto. For instance, the connection terminal 1220 can be prepared in the form of a pin inserted into the external power source or connected to the external power source through a wire.

According to the lighting system as described above, at least one of the light guide member, the diffusion sheet, the light collection sheet, the brightness enhancement sheet and the fluorescent sheet is provided in the path of the light emitted from the light emitting module, so that the desired optical effect can be achieved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
a conductive support substrate including plural pairs of first and second conductive layers;
a light emitting structure layer provided on the conductive support substrate, the light emitting structure layer including a first conductive semiconductor layer, a second conductive semiconductor layer, and an active layer between the first and second conductive semiconductor layers; and
an electrode on the light emitting structure layer, wherein the first conductive layer has compressive stress and the second conductive layer has tensile stress, and wherein the first and second conductive layers are made of a metal.

2. The light emitting device of claim 1, wherein the first and second conductive layers are formed by using a same material.

3. The light emitting device of claim 2, wherein the first and second conductive layers are formed by varying sputtering power, pressure of sputtering gas, a substrate temperature and a sputtering power source.

4. The light emitting device of claim 1, further comprising a reflective layer or an ohmic contact layer between the conductive support substrate and the light emitting structure layer.

5. The light emitting device of claim 1, wherein the first and second conductive layers include at least one of Cu, Mo, Al, Ni or Cu—W.

6. The light emitting device of claim 1, wherein the conductive support substrate includes 30 to 70 pairs of the first and second conductive layers, and the first and second conductive layers have a thickness of 0.1 µm to 10 µm, respectively.

7. The light emitting device of claim 1, wherein the conductive support substrate has a thickness of 50 µm to 200 µm, and compressive stress or tensile stress in a range of more than 0 to 2000 MPa.

8. A light emitting device, comprising:
a conductive support substrate including plural pairs of first and second conductive layers;
a light emitting structure layer provided on the conductive support substrate, the light emitting structure layer including a first conductive semiconductor layer, a second conductive semiconductor layer, and an active layer between the first and second conductive semiconductor layers; and
an electrode provided on the light emitting structure layer, wherein a material of the first conductive layer is the same as that of the second conductive layer, and wherein one of the first or second conductive layers has tensile stress properties and the other of the first or second conductive layers has compressive stress properties.

9. The light emitting device of claim 8, further comprising a reflective layer between the conductive support substrate and the light emitting structure layer.

10. The light emitting device of claim 8, further comprising an ohmic contact layer between the conductive support substrate and the light emitting structure layer.

11. The light emitting device of claim 8, further comprising an anti-oxidation layer under the conductive support substrate.

12. The light emitting device of claim 8, further comprising a diffusion barrier layer under the conductive support substrate and a solder metal layer under the diffusion barrier layer.

13. The light emitting device of claim 12, further comprising an anti-oxidation layer under, the solder metal layer.

14. The light emitting device of claim 8, wherein the first and second conductive layers include at least one of Cu, Mo, Al, Ni or Cu—W.

15. The light emitting device of claim 8, wherein the conductive support substrate includes 2 to 80 pairs of first and second conductive layers.

16. The light emitting device of claim 15, wherein the conductive support substrate includes 30 to 70 pairs of first and second conductive layers.

17. The light emitting device of claim 8, wherein the first and second conductive layers have a thickness of 0.1 μm to 10 μm, respectively.

18. The light emitting device of claim 17, wherein one of the first or second conductive layers has a thickness of 0.4 μm to 0.8 μm, and the other of the first or second conductive layers has a thickness of 0.8 μm to 1.2 μm.

19. The light emitting device of claim 8, wherein the conductive support substrate has a thickness of 50 μm to 200 μm, and compressive stress or tensile stress in a range of more than 0 to 2000 MPa.

20. A light emitting device package comprising:
a package body;
first and second electrode layers on the package body;
a light emitting device electrically connected to the first and second electrode layers; and
a molding member on the light emitting device, wherein the light emitting device includes:
a conductive support substrate including plural pairs of first and second conductive layers;
a light emitting structure layer provided on the conductive support substrate, the light emitting structure layer including a first conductive semiconductor layer, a second conductive semiconductor layer, and an active layer between the first and second conductive semiconductor layers; and
an electrode on the light emitting structure layer, wherein the first and second conductive layers are formed of the same material, and wherein one of the first or second conductive layers has tensile stress properties and the other of the first or second conductive layers has compressive stress properties.

* * * * *